US008038191B2

(12) United States Patent
Shim et al.

(10) Patent No.: US 8,038,191 B2
(45) Date of Patent: Oct. 18, 2011

(54) PICK AND PLACE APPARATUS

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Dong Hyun Yo, Bucheon-si (KR)

(73) Assignee: Techwing Co., Ltd., Hwaseong-si, Gyeonggi-do (KR)

( * ) Notice: Subject to any disclaimer, the term of this patent is extended or adjusted under 35 U.S.C. 154(b) by 629 days.

(21) Appl. No.: 12/103,306

(22) Filed: Apr. 15, 2008

(65) Prior Publication Data

US 2008/0213078 A1 Sep. 4, 2008

Related U.S. Application Data

(63) Continuation of application No. PCT/KR2006/004934, filed on Nov. 22, 2006.

(30) Foreign Application Priority Data

Nov. 23, 2005 (KR) .................. 10-2005-0112390

(51) Int. Cl.
*B25J 15/06* (2006.01)
*B65G 47/91* (2006.01)
(52) U.S. Cl. ........................................ 294/65; 294/87.1
(58) Field of Classification Search .............. 294/64.1, 294/65, 87.1; 414/752.1; 198/460.2, 468.3
See application file for complete search history.

(56) References Cited

U.S. PATENT DOCUMENTS

| 7,690,706 | B2 * | 4/2010 | Wild et al. ............. 294/65 |
| 7,850,217 | B2 * | 12/2010 | Lo ........................ 294/65 |
| 2002/0153735 | A1 * | 10/2002 | Kress ................. 294/87.1 |

FOREIGN PATENT DOCUMENTS

| JP | 08-181190 | 7/1996 |
| JP | 2004-039706 A | 2/2004 |
| KR | 1998-0033607 | 7/1998 |
| KR | 20010001886 | 1/2001 |
| KR | 20020061194 | 7/2002 |
| KR | 20030029266 | 4/2003 |
| KR | 10-0596739 B1 | 6/2006 |
| KR | 10-0648919 | 11/2006 |
| WO | 2007/058459 A1 | 5/2007 |

* cited by examiner

*Primary Examiner* — Paul T Chin
(74) *Attorney, Agent, or Firm* — BainwoodHuang

(57) ABSTRACT

A pick and place apparatus includes a plurality of device holing elements in a predetermined arrangement; a power supply mechanism for supplying a power for controlling a horizontal pitch between the plurality of device holding elements; a power transmission mechanism for delivering the power from the power supply mechanism to the plurality of device holding elements as a translational force in a horizontal direction; a first linear motion guide mechanism for guiding horizontal movements of some of the plurality of device holding elements; and a second linear motion guide mechanism disposed below the first linear motion guide mechanism, for guiding horizontal movements of the other device holding elements. The plurality of device holding elements are slidably coupled to the first and the second linear motion guide mechanism alternately.

9 Claims, 10 Drawing Sheets

PICK AND PLACE APPARATUS

This application is a Continuation Application of PCT International Application No. PCT/KR2006/004934 filed on Nov. 22, 2006, which designated the United States.

FIELD OF THE INVENTION

The present invention relates to a pick and place apparatus employed in a test handler for use in testing semiconductor devices; and, more particularly, to a coupling mechanism between the device holding elements in the pick and place apparatus and a linear motion guide for guiding movements of the device holding elements in a left-and-right direction (in general, defined as an X-axis direction and hereinafter, referred to as a "horizontal direction").

BACKGROUND OF THE INVENTION

A test handler is an apparatus for testing semiconductor devices in a certain test environment to inspect the qualities of the semiconductor devices after they are fabricated. Techniques related to the test handler are disclosed in many published documents including Korean Patent Publication No. 2003-0029266 (entitled "Test Handler").

To conduct a test by using the test handler, it is required to transfer semiconductor devices from a customer tray, which is used to accommodate the semiconductor devices after their fabrication, into a test tray, which is used to accommodate the semiconductor devices during the test. After the completion of the test, the semiconductor devices should be transferred back into the customer tray. The present invention pertains to a pick and place apparatus for transferring the semiconductor devices between the customer tray and the test tray. For the purpose, the pick and place apparatus includes a plurality of device holding elements operated to grasp or quit the grasp of the semiconductor devices.

As for the customer tray, since the customer tray is used to load or store the semiconductor devices therein, the customer tray is designed to provide a small interval between the semiconductor devices loaded therein to accommodate as many semiconductor devices as possible on the same area. Meanwhile, since a certain amount of interval needs to be maintained between the semiconductor devices for the test of the semiconductor devices, the test tray is designed to provide a relatively larger interval between the semiconductor devices loaded therein, in comparison with the customer tray.

Accordingly, the pitch between the device holding elements of the pick and place apparatus should be at a minimum level when they pick and grasp the semiconductor devices from the customer tray or quit the grasp of the devices, while the pitch should be at a maximum level when the device holding elements pick and grasp the semiconductor devices from the test tray or quit the grasp of them. For the purpose, the pick and place apparatus needs to have a means for controlling the intervals between the plurality of device holding elements in a preset arrangement. Techniques related thereto are disclosed in Korean Patent Publication No. 10-1998-033607 (entitled "Pick and Place of Semiconductor Device Test Equipment": Reference 1), Korean Patent Publication No. 10-2002-0061194 (entitled "Pick and Place of Semiconductor Device Test Equipment": Reference 2), and so forth.

Reference 1 describes a technique for controlling horizontal pitches between device holding elements by connecting them with a link and supplying power to device holding elements at both ends of the array as translational forces for moving them horizontally in opposite directions. Reference 2 discloses a technique for controlling horizontal pitches between device holding elements by way of supplying a translational force in horizontal direction to all of the device holding elements by using a cam plate, and it also proposes a technique for controlling the pitches by using a cam shaft.

In accordance with Reference 1 or Reference 2, there should be prepared a linear motion guide mechanism for guiding horizontal movements of the device holding elements, as exemplified in Reference 2 (slide members assigned as reference numerals 35 and 36 in Reference 2).

Among various linear motion guide mechanisms, a LM guide, a ball spline, or the like are used for the pick and place apparatus. The LM guide or the ball spline has a guide rail and coupling blocks configured to be slid along the guide rail, wherein the device holding elements are fixed at the coupling blocks via, e.g., bolts or the like. If the sizes of the guide rail and the coupling blocks are set to be large, the device holding elements can be more firmly coupled to the coupling blocks and the stability of the horizontal movements of the device holding elements can be improved, resulting in enhancement of endurance and reliability of the entire pick and place apparatus. However, the size increase of the guide rail and the coupling blocks would also result in the problem of weight increase of the apparatus. If the sizes of the guide rail and the coupling blocks are reduced, on the other hand, the endurance and reliability of the pick and place apparatus would be reduced, though the apparatus can be made lighter.

Meanwhile, in the conventional pick and place apparatus, a first and a second linear motion guide mechanism are vertically arranged in parallel to each other while maintaining a predetermined interval therebetween, and each of the device holding elements is engaged with both of the first and the second linear motion guide mechanism to be guided by them horizontally.

However, the conventional pick and place apparatus, which has the configuration where each of the device holding elements is engaged with both of the linear motion guide mechanisms, has structural limits in its size, operational characteristics and production efficiency. Those limitations will be described hereinafter with reference to FIG. 1 showing an example using LM guides as the linear motion guide mechanisms.

First, in case of fixing a device holding element 11 at an LM block (coupling block) 13a of a LM guide 13 by using bolts 12, the bolts 12 need to be fastened with a great torque to increase the endurance of the pick and place apparatus. However, since the tightening torque for the bolts 12 should be set in proportion of the size of the LM block 13a, there is a limit in increasing the tightening torque of the bolts 12. Specifically, if the LM block 13a has a relative large size, the LM block 13a would not be deformed by a bolt tightening torque even though the bolt tightening force is set to be great, whereas if the size of the LM block 13a is small, the LM block 13a would be readily deformed by the bolt tightening torque, thus being brought into excessively close contact with the LM rail 13b. For the reason, the tightening force for the bolts 12 should be set in proportion to the size of the LM block 13a. Accordingly, to increase the endurance of the pick and place apparatus, it is preferable to use a LM guide 13 of a large size having a large LM block 13a. Further, since the sizes of the LM block 13a and the LM rail 13b are in proportion to the stability of linear movements of the device holding element 11, the LM block 13a and the LM rail 13b are required to have large sizes in the aspect of improving the reliability of the pick and place apparatus as well. That is, if the LM block 13a has a relatively small size or the LM rail 13b has an excessively small vertical width, the linear motion characteristic of the LM guide 13 would be degraded by a moment or a weight applied to the LM block 13a. Therefore, a LM guide 13 of a large size is preferred.

In contrast, to reduce the size of the pick and place apparatus, the LM block 13a is required to be as small as possible. Though the size (especially, the width) of the LM block 13a may not have a great influence on the entire size of the apparatus if only one LM block 13a is used for the LM rail 13b, the width of the LM block 13a would be an important factor for determining the entire size of the pick and place apparatus given that the apparatus has a configuration in which a plurality of device holding elements 11 are horizontally arranged (in general, eight device holding elements are arranged in a row). Therefore, a LM guide 13 of a small size is preferred.

Among the characteristics of the pick and place apparatus as described above, the size and the weight of the apparatus would have a greater impact on the entire performance (reaction time, operational accuracy, etc.) of the test handler than the endurance and the reliability of the apparatus. Thus, a small-size LM guide with a LM block of a small width is usually employed in the field, bearing the low endurance and reliability of the apparatus. Thus, the cycle of maintenance of the pick and place apparatus is very short. Specifically, when using a small-size LM guide with a LM block of a small width, though it is intended to complement the bolt coupling force between the device holding element and the LM block is intended, such a coupling method is incomplete in view of the characteristic of the pick and place apparatus that its operation is repeated for a long period of time. Thus, frequent maintenance works are needed.

Further, if the LM guide 13 is designed to have a size smaller than the required size to reduce the size of the pick and place apparatus, the bolt tightening torque having a direct influence on the operational characteristic of the LM guide 13 should be controlled very precisely in the manufacturing process of the pick and place apparatus, which is very troublesome. If the bolt tightening torque is greater than a tolerance of the LM block 13a, the LM block 13a would suffer deformation and would be brought into excessively close contact with the LM rail 13b, thus hampering the horizontal movements of the device holding elements 11. Thus, when using the LM guide 13 whose size is smaller than the required size, a precise control of the bolt tightening torque is needed, which would result in deterioration in production efficiency and increase of production of inferior goods.

Moreover, in the configuration where each device holding element 13 is engaged with both of the LM guides 13 and 14, the LM guides 13 and 14 should be fabricated in a pair for the reason of existence of mutual limitations between the pair of LM guides 13 and 14. Accordingly, the unit cost of the LM guides 13 and 14 increases, resulting in increase of manufacturing costs of the pick and place apparatus.

In addition, as disclosed in Korean Patent Application No. 2005-17464 that was commonly assigned to the applicant of the present invention prior to the filing date of the present application, in a configuration where each device holding element 11 is engaged with both of the two LM guides 13 and 14 and a power supply mechanism having a power transmission shaft such as a screw guide shaft for guiding the movements of the device holding element 11 while transmitting a moving force thereto, a vertical (Z-axial) tolerance and a parallelism between the upper LM guide 13 and the lower LM guide 14 should be controlled as well as a vertical (Z-axial) tolerance and a parallelism between the upper LM guide 13 and the screw guide shift and a vertical (Z-axial) tolerance and a parallelism between the lower LM guide 14 and the screw guide shift. Actually, however, it is impossible to set the Z-axial tolerances and parallelisms of three different related parts in a general manufacture or assembly technique. Thus, the unit cost of a frame of the pick and place apparatus having the LM guides 13, 14 and the screw guide shaft fixed thereat would be increased, which would result in a great increase of manufacturing costs of the pick and place apparatus.

SUMMARY OF THE INVENTION

It is, therefore, a first object of the present invention to provide a pick and place apparatus capable of improving its endurance and reliability by increasing the size of a linear motion guide mechanism, while preventing deterioration in performance of the apparatus by reducing the entire size and weight of the apparatus.

It is a second object of the present invention to provide a pick and place apparatus allowing a simple and easy tolerance management, thus improving productivity and reducing manufacturing costs.

It is a third object of the present invention to provide a pick and place apparatus capable of accomplishing the first and the second object more effectively in a configuration where device holding elements are arranged in a front row and a rear row symmetrically.

In accordance with a first embodiment of the present invention, there is provided a pick and place apparatus including a plurality of device holing elements in a predetermined arrangement; a power supply mechanism for supplying a power for controlling a horizontal pitch between the plurality of device holding elements; a power transmission mechanism for delivering the power from the power supply mechanism to the plurality of device holding elements as a translational force in a horizontal direction; a first linear motion guide mechanism for guiding horizontal movements of some of the plurality of device holding elements; and a second linear motion guide mechanism disposed below the first linear motion guide mechanism, for guiding horizontal movements of the other device holding elements.

In accordance with a second embodiment of the present invention, there is provided a pick and place apparatus including a plurality of device holding elements arranged in a front row; a multiplicity of device holding elements arranged in a rear row behind the front row; a power supply mechanism for supplying a power for controlling a horizontal pitch between the device holding elements in each row; a front-row power transmission mechanism for delivering the power from the power supply mechanism to the plurality of device holding elements in the front row as a translational force in a horizontal direction; a rear-row power transmission mechanism for delivering the power from the power supply mechanism to the multiplicity of device holding elements in the rear row as a translational force in the horizontal direction; a first front-row linear motion guide mechanism for guiding horizontal movements of some of the plurality of device holding elements in the front row; a second front-row linear motion guide mechanism for guiding horizontal movements of the other device holding elements in the front row; a first rear-row linear motion guide mechanism for guiding horizontal movements of some of the multiplicity of device holding elements in the rear row; and a second rear-row linear motion guide mechanism for guiding horizontal movements of the other device holding elements in the rear row, wherein the first and the second front-row linear guide mechanism are disposed at a front portion of the apparatus, while the first and the second rear-row linear guide mechanism are disposed at a rear portion of the apparatus.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings.

Figure 1:
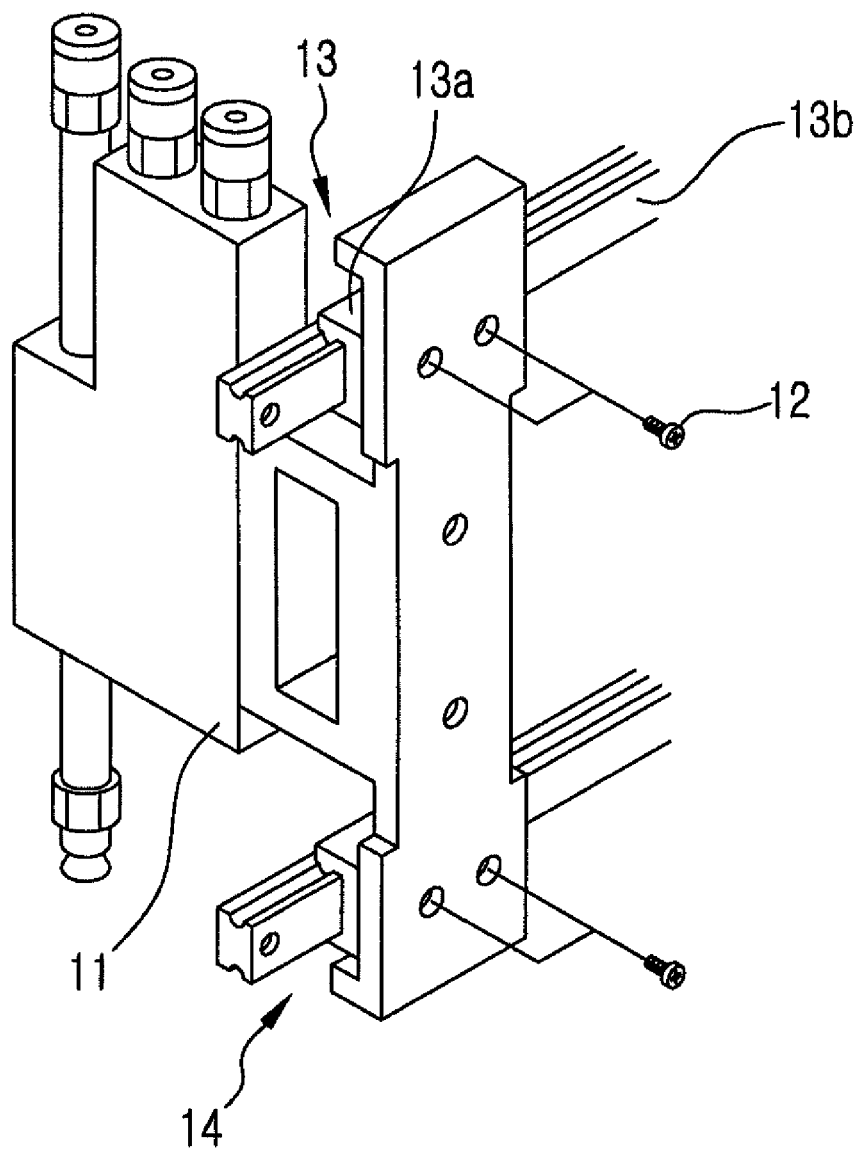
FIG. 1 is a perspective view showing a coupling mechanism between device holding elements and linear motion (LM) guides.
Figure 2:
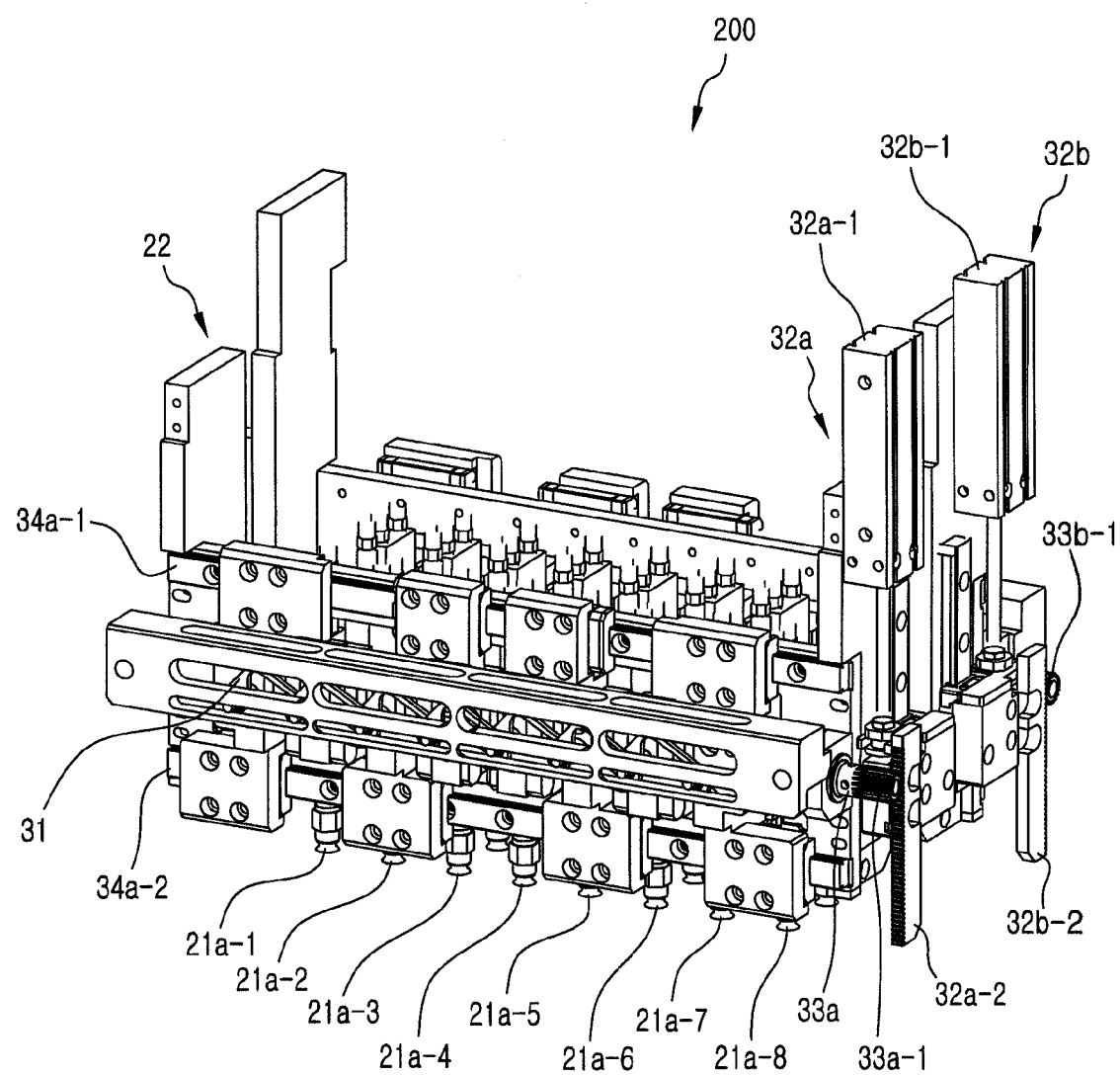
FIG. 2 sets a front perspective view of a pick and place apparatus in accordance with a first embodiment of the present invention.
Figure 3:
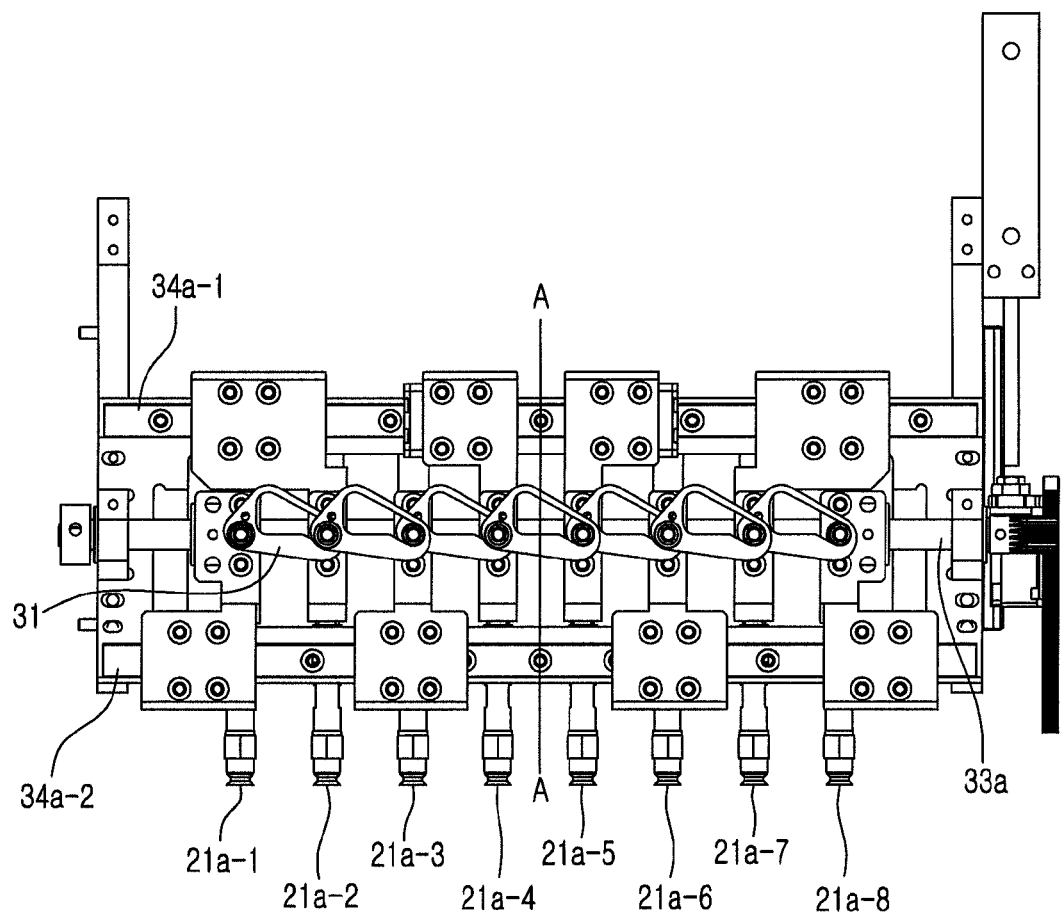
FIG. 3 presents a front view of the pick and place apparatus shown in FIG. 2.

FIG. 2 sets a front perspective view of a pick and place apparatus 200 in accordance with a embodiment of the present invention; FIG. 3 shows a front view of the pick and place apparatus 200 in FIG. 2; and FIG. 4 presents a perspective view of major components of the pick and place apparatus 200 in FIG. 2.

The pick and place apparatus 200 shown in FIG. 2 is invented by combining the present invention with the technical conception of Korean Patent Application No. 2005-17464 that was commonly assigned to the applicant of the present invention prior to the filing date of the present application, wherein the pick and place apparatus 200 is described for the case of employing a screw guide shaft for allowing a plurality of device holding elements to move in a horizontal direction.

Figure 4:
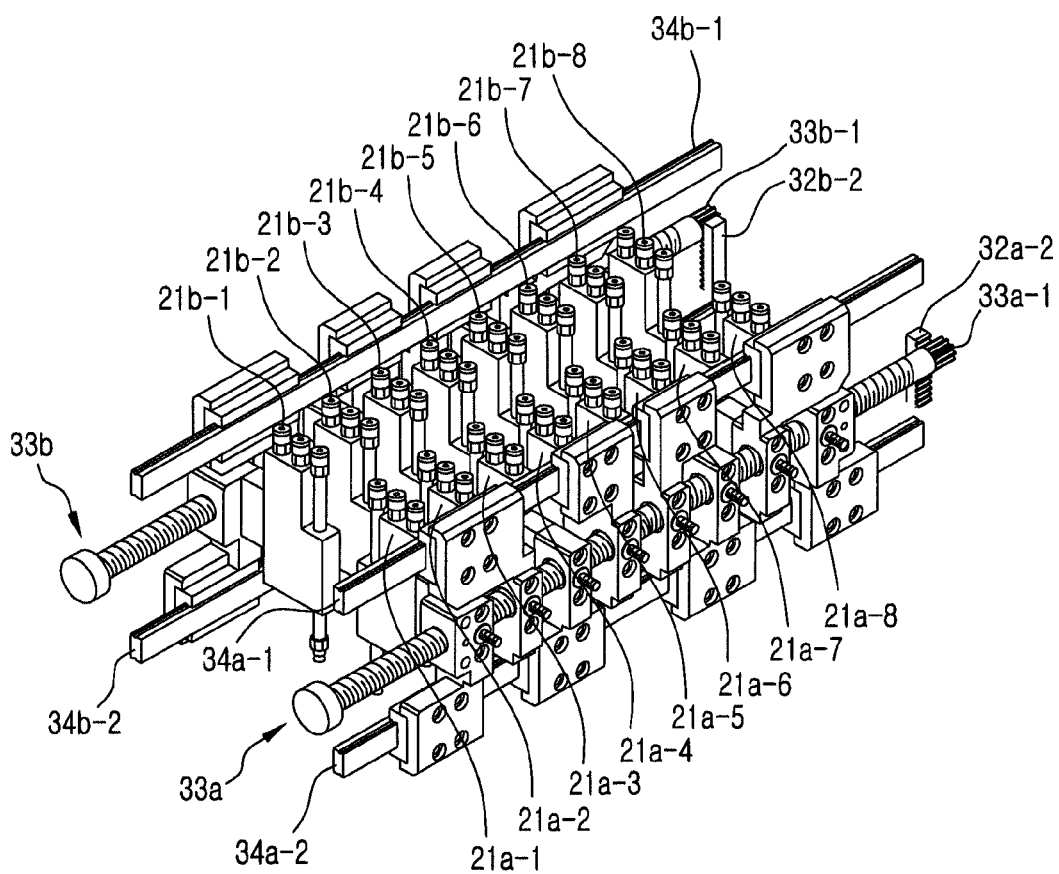
FIG. 4 depicts a perspective view of major components of the pick and place apparatus of FIG. 2.

Referring to FIGS. 2 to 4, the pick and place apparatus 200 includes: device holding elements 21a-1 to 21a-8 arranged in a front row; device holding elements 21b-1 to 21b-8 arranged in a rear row; a to-and-fro directional pitch control unit 22; and a horizontal (left-and-right directional) pitch control unit.

Figure 5:
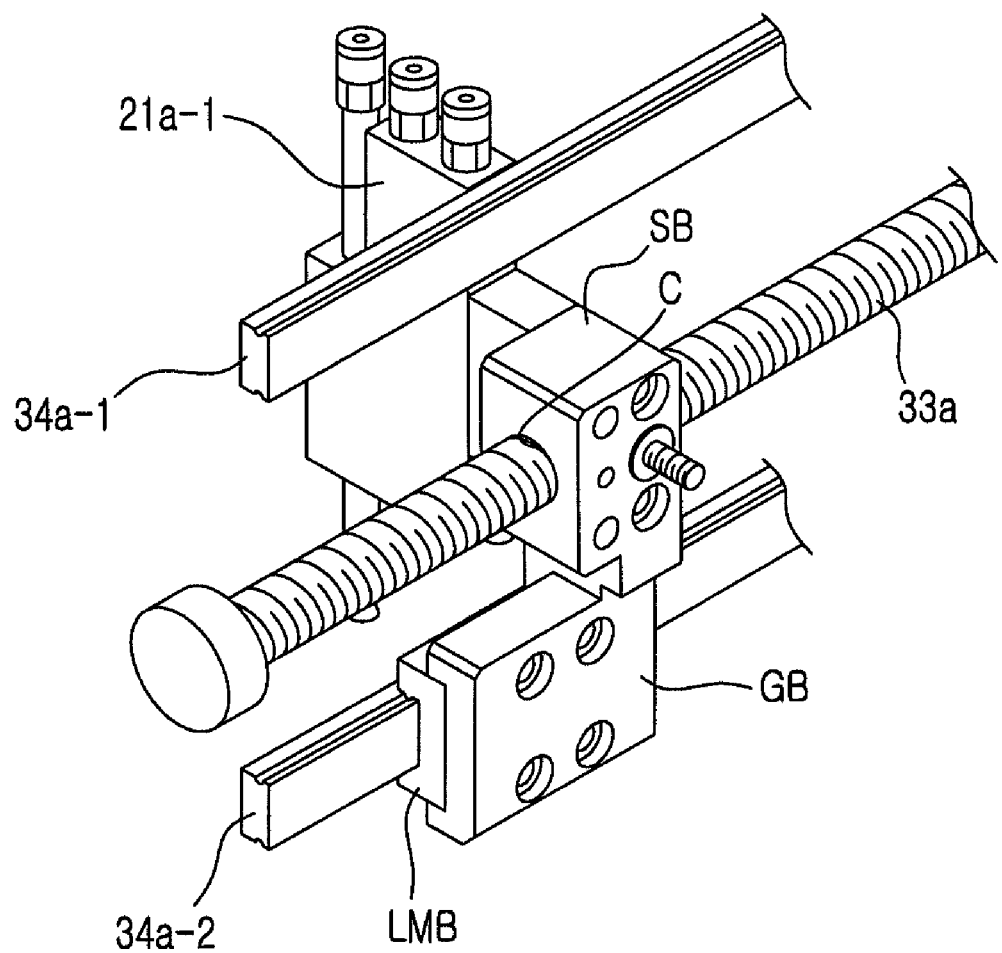
FIG. 5 provides a perspective view of a device holding element employed in the pick and place apparatus of FIG. 2.

Eight of device holding elements 21a-1 to 21a-8 are arranged in the front row, while eight of device holding elements 21b-1 to 21b-8 are arranged in the rear row to face the device holding elements 21a-1 to 21a-8 in the front row in one-to-one correspondence. The device holding elements 21a-1 to 21a-8 and 21b-1 to 21b-8 are adapted to grasp or quit the grasp of semiconductor devices to transfer the semiconductor devices from a customer tray (not shown) to a test tray (not shown) or from the test tray back to the customer tray. The device holding elements 21a-1 to 21a-8 and 21b-1 to 21b-8 have slightly different configurations depending on their locations. For example, as shown in FIG. 5, each of the device holding elements 21a-1 to 21a-8 and 21b-1 to 21b-8 has a guide coupling block GB to be engaged with an LM block LMB of one of a first and a second front-row LM guide 34a-1 and 34a-2 and a first and a second rear-row LM guide 34b-1 and 34b-2 to be explained later. In particular, each of a first and an eighth front-row device holding element 21a-1 and 21a-8 and a first and an eighth rear-row device holding element 21b-1 and 21b-8 further includes a shaft coupling block SB to be described later. The guide coupling blocks GB and the shaft coupling blocks SB are preferably formed as one body, but they can be configured to be separable if necessary. Moreover, though the other device holding elements can also have shaft coupling portions similar to the shaft coupling blocks SB of the device holding elements 21a-1, 21a-8, 21b-1 and 21b-8, the shaft coupling blocks SB of the device holding elements 21a-1, 21a-8, 21b-1 and 21b-8 are different from the other shaft coupling portions in view of a presence of female screw thread engaged with screw guide shafts 33a and 33b and a gap from the screw guide shafts 33a and 33b.

The to-and-fro directional pitch control unit 22 is used to control to-and-fro directional pitches between the front-row device holding elements 21a-1 to 21a-8 and the rear-row device holding elements 21b-1 to 21b-8. The to-and-fro directional pitch control unit 22 is well-known in the art in various published documents, and detailed description thereof is disclosed in Korean Patent Application No. 2005-17464 that was commonly assigned to the applicant of the present invention prior to the filing data of the present application. Thus, detailed description of the to-and-fro directional pitch control unit 22 will be omitted here.

The horizontal pitch control unit is used to control pitches between the neighboring device holding elements in each of the front and the rear row. For the purpose, the horizontal pitch control unit includes a plurality of pitch setting rings 31, a power supply mechanism, a first and a second power transmission mechanism, a first and a second front-row LM guide 34a-1 and 34a-2 for guiding the linear movements of the front-row device holding elements 21a-1 to 21a-8 and a first and a second rear-row LM guide 34b-1 and 34b-2 for guiding the linear movements of the rear-row device holding elements 21b-1 to 21b-8. Each part of the horizontal pitch control unit having the above configuration will be described in detail hereinafter.

The plurality of pitch setting rings 31 includes seven front-row rings and seven rear-row rings. The pitch setting rings 31 serve to connect every one of the device holding elements 21a-1 to 21a-8 and 21b-1 to 21b-8 to its horizontally neighboring ones so as to enable horizontal movements of the device holding elements 21a-1 to 21a-8 and 21b-1 to 21b-8 such that horizontal motions can be transmitted between the device holding elements 21a-1 to 21a-8 and 21b-1 to 21b-8, while delimiting a maximum horizontal pitch between the device holding elements 21a-1 to 21a-8 and 21b-1 to 21b-8.

The power supply mechanism includes a front-row power supply mechanism 32a for supplying a power for controlling the horizontal pitch between the front-row device holding elements 21a-1 to 21a-8; and a rear-row power supply mechanism 32b for supplying a power for controlling the horizontal pitch between the rear-row device holding elements 21b-1 to 21b-8. Each power supply mechanism 32a (32b) includes: a pneumatic cylinder 32a-1 (32b-1); and a rack 32a-2 (32b-2) which is moved up and down by the operation of the pneumatic cylinder 32a-1 (32b-1). Here, it is also possible to supply a power for controlling the horizontal pitches of both of the front-row and the rear-row device holding elements by using a single power supply mechanism, as disclosed in Korean Patent Application No. 10-2005-109164 that was commonly assigned to the applicant of the present invention prior to the filing date of the present application.

Figure 6:
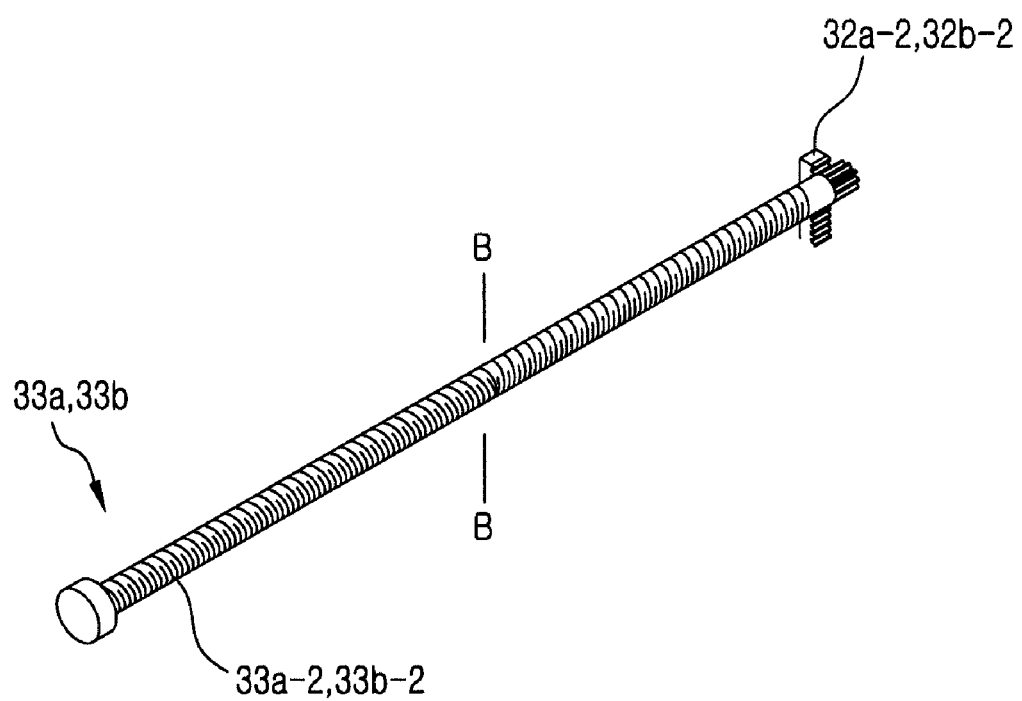
FIG. 6 offers a perspective view of a screw guide shaft employed in the pick and place apparatus of FIG. 2.

The first and the second power transmission mechanism have a screw guide shaft 33a (33b) provided with a pinion 33a-1 (33b-1) which is rotated with its one side engaged with the rack 33a-2 (33b-2). FIG. 6 shows a perspective view of the screw guide shaft 33a (33b). As shown in FIG. 6, the screw guide shaft 33a (33b) has a pair of male screw threads 33a-2 (33b-2), one of which is a clockwise screw thread and the other is a counterclockwise screw thread with respect to a central line BB.

As for the device holding elements 21a-1 to 21a-8 and 21b-1 to 21b-8 arranged at both ends of the front row and the rear row, i.e., the first and the eighth front-row device holding element 21a-1 and 21a-8 and the first and the eighth rear-row device holding element 21b-1 and 21b-2, each of them has a shaft coupling block SB having a shaft through hole C provided with a female screw thread corresponding to the screw guide shaft 33a (33b), as illustrated in FIG. 5. Accordingly, as the screw guide shafts 33a and 33b are rotated, the first and the eighth front-row device holding element 21a-1 and 21a-8 and the first and the eighth rear-row device holding element 21b-1 and 21b-8 are moved in opposite directions.

The first front-row LM guide 34a-1 is disposed above the front-row screw guide shaft 33a to guide linear movements of a second, a fourth, a fifth and a seventh device holding element 21a-2, 21a-4, 21a-5 and 21a-7 in the front row. Also, the second front-row LM guide 34a-2 is disposed below the front-row screw guide shaft 33a to guide linear movements of the other device holding elements 21a-1, 21a-3, 21a-6, 21a-8 in the front row. That is, the front-row device holding elements 21a-1 to 21a-8 are slidably coupled to the first front-row LM guide 34a-1 and the second front-row LM guide 34a-2 are arranged alternately and symmetrically with respect to a vertical central line AA. In general, a minimum horizontal pitch between the device holding elements is determined by their widths. However, if the sum of the widths of the LM blocks coupled to one LM rail or the sum of the guide coupling blocks connected to those LM blocks is larger than the sum of the widths of all of the device holding elements, the minimum horizontal pitch between the device holding elements would be determined by the widths of the LM blocks or the guide coupling blocks. Given that the device holding elements are already designed to have a minimum width by considering the distance between the semiconductor devices on the customer tray, the sum of the LM blocks or the guide coupling blocks should not be set to be larger than the sum of the widths of the device holding elements. Accordingly, to fully utilize the fact that at least the minimum width is determined by the device holding elements and the device holding elements are moved in opposite directions facing each other with respect to the vertical central line AA, the front-row device holding elements 21a-1 to 21a-8 are configured to be in symmetrical arrangement with respect to the vertical central line AA, and alternately coupled to the first and the second front-row LM guide 34a-1 and 34a-2. That is, referring back to FIG. 2 showing the pick and place apparatus 200 in accordance with the embodiment of the present invention, the guide coupling blocks GB of the second and the seventh front-row device holding element 21a-2 and 21a-7 located at both ends of the first front-row LM guide 34a-1 and the guide coupling blocks GB of the first and the eighth front-row device holding element 21a-1 and 21a-8 have symmetrical shapes deflected toward the exterior sides. Further, the other front-row device holding elements 21a-3, 21a-4, 21a-5, 21a-6 also have symmetrical shapes configured not to interfere with each other or delimit the minimum pitch therebetween.

Likewise, the first rear-row LM guide 34b-1 is disposed above the rear-row screw guide shaft 33b to guide linear movements of the second, the fourth, the fifth and the seventh device holding element 21b-2, 21b-4, 21b-5 and 21b-7 of the rear row. Further, the second rear-row LM guide 34b-2 is disposed below the rear-row screw guide shaft 33b to guide linear movements of the other device holding elements 21b-1, 21b-3, 21b-4 and 21b-8 of the rear row.

As described above, in case the device holding elements 21a-1 to 21a-8 and 21b-1 to 21b-8 are arranged in two rows in the to-and-fro direction as in the pick and place apparatus 200 shown in FIG. 2, the pitches between the front-row device holding elements 21a-1 to 21a-8 and the rear-row device holding elements 21b-1 to 21b-8 also need to be controlled. Thus, if any separate component is intervened between the front-row device holding elements 21a-1 to 21a-8 and the rear-row device holding elements 21b-1 to 21b-8 (for example, if a LM guide is intervened therebetween), it becomes difficult to obtain a minimum pitch in the to-and-fro direction, and if it is attempted to obtain the minimum pitch in such a case, the design of the device holding elements would be complicated. Accordingly, as illustrated in FIG. 4, it is more preferable to dispose the first and the second front-row LM guides 34a-1 and 34a-2 at a front portion of the pick and place apparatus 200 in a vertical direction and the first and the second rear-row LM guides 34b-1 and 34b-2 at a rear portion of the apparatus 200 in the vertical direction so that they make no interference with the to-and-fro directional pitches between the front-row device holding elements 21a-1 to 21a-8 and the rear-row device holding elements 21b-1 to 21b-8.

Below, a horizontal pitch control operation of the pick and place apparatus 200 configured as described above will be described with reference to FIGS. 7 and 8, wherein the description will be provided only for the front-row components for the simplicity of explanation.

Figure 7:
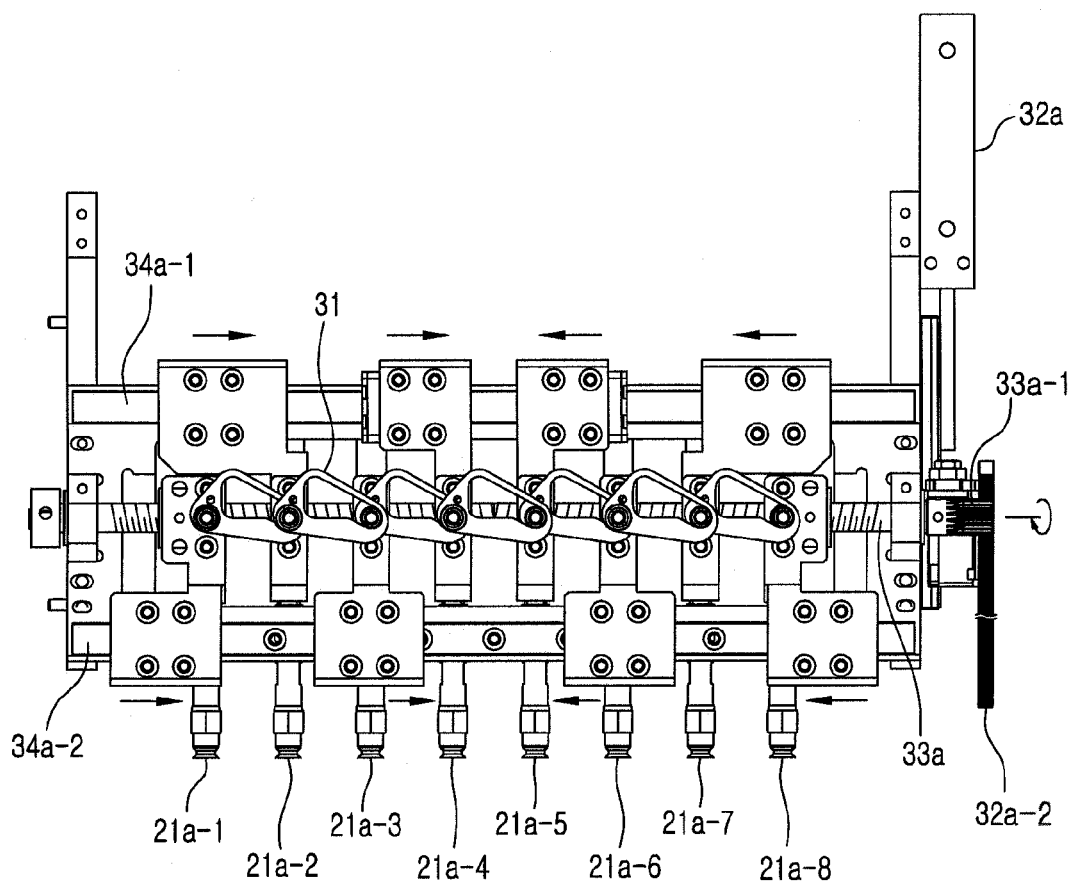
FIGS. 7 and 8 illustrate an operational status of the pick and place apparatus of FIG. 2.
Figure 8:
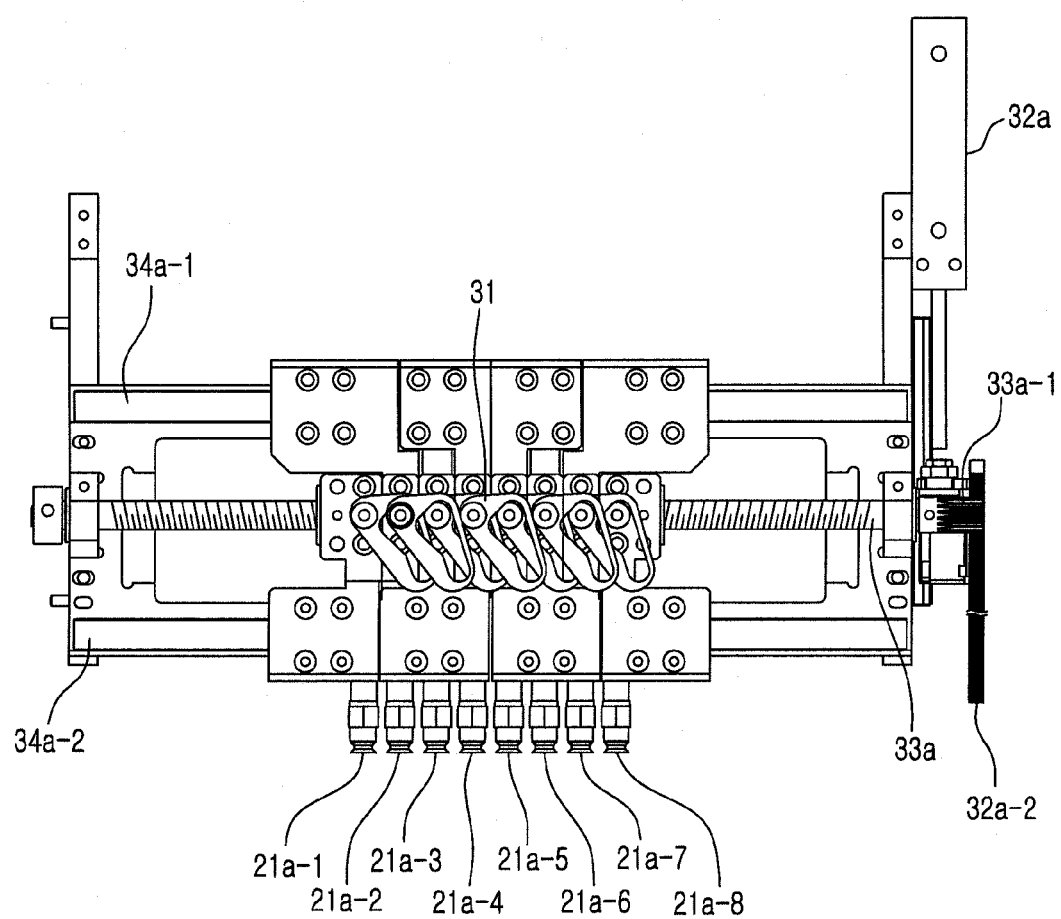

From the state shown in FIG. 7, if the pneumatic cylinder 32a-1 is operated to move the rack 32a-2 downward, the front-row screw guide shaft 33a is rotated in a direction indicated by an arrow in FIG. 7, whereby the device holding elements 21a-1 and 21a-8 at both ends of the shaft 33a are made to move in opposite directions facing each other, to thereby reduce pitches therebetween. As the device holding elements 21a-1 and 21a-8 are moved continuously, they come into contact with their neighboring device holding elements 21a-2 and 21a-7, respectively, and thereafter, they are kept being moved until all the device holding elements 21a-1 to 21a-8 are in contact with each other, while maintaining a minimum pitch therebetween as illustrated in FIG. 8. Referring to FIG. 8, the guide blocks GB, each of which has a large width, are configured to be coupled to each other and maintain appropriate shapes when they come into contact with each other without interfering with or delimiting the minimum pitch determined by the widths of the device holding elements 21a-1 to 21a-8. If the rack 32a-2 is moved upward from the state shown in FIG. 8, the device holding elements 21a-1 to 21a-8 are moved away from each other to enlarge the pitches therebetween until they reach the state shown in FIG. 7 where the maximum pitch therebetween is delimited by the pitch setting rings 31.

Meanwhile, since each of the device holding elements 21a-1 to 21a-8 and 21b-1 to 21b-8 is coupled to only one of the LM guides 34a-1, 34a-2, 34b-1 and 34b-2, a parallelism or a tolerance between the LM guides 34a-1, 34a-2, 34b-1 and 34*b*-2 themselves need not be controlled precisely, but it is only required to manage a tolerance and a parallelism between the LM guides 34*a*-1, 34*a*-2, 34*b*-1, 34*b*-2 and the screw guide shafts 33*a* and 33*b*. In case there is installed another power transmission shaft such as the screw guide shafts 33*a* and 33*b* for delivering translational force in horizontal direction while concurrently guiding the movements of the device holding elements, the same tolerance management is required.

Figure 9:
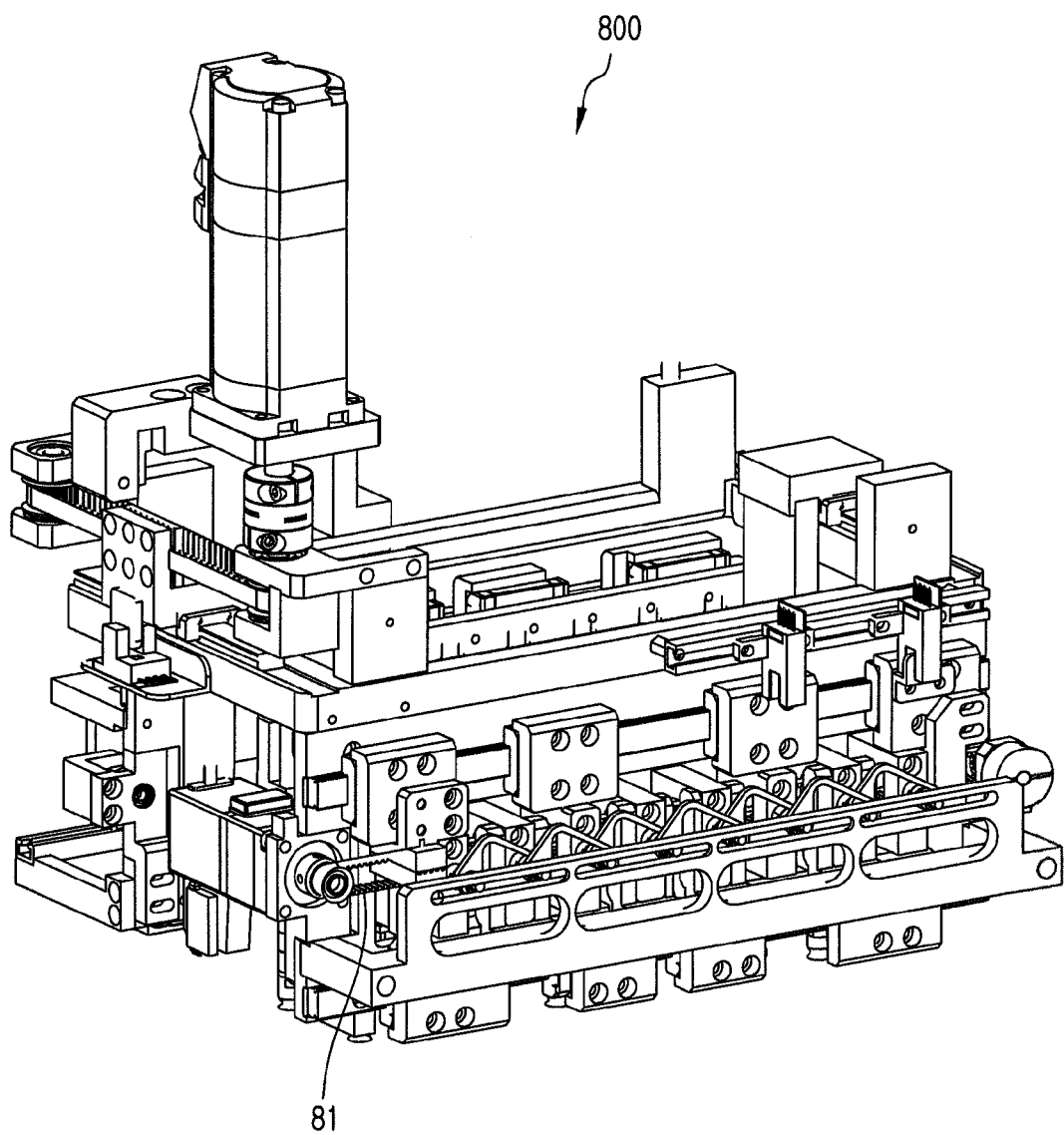
FIGS. 9 and 10 present a front perspective view and a front view of a pick and place apparatus in accordance with a second embodiment of the present invention, respectively.
Figure 10:
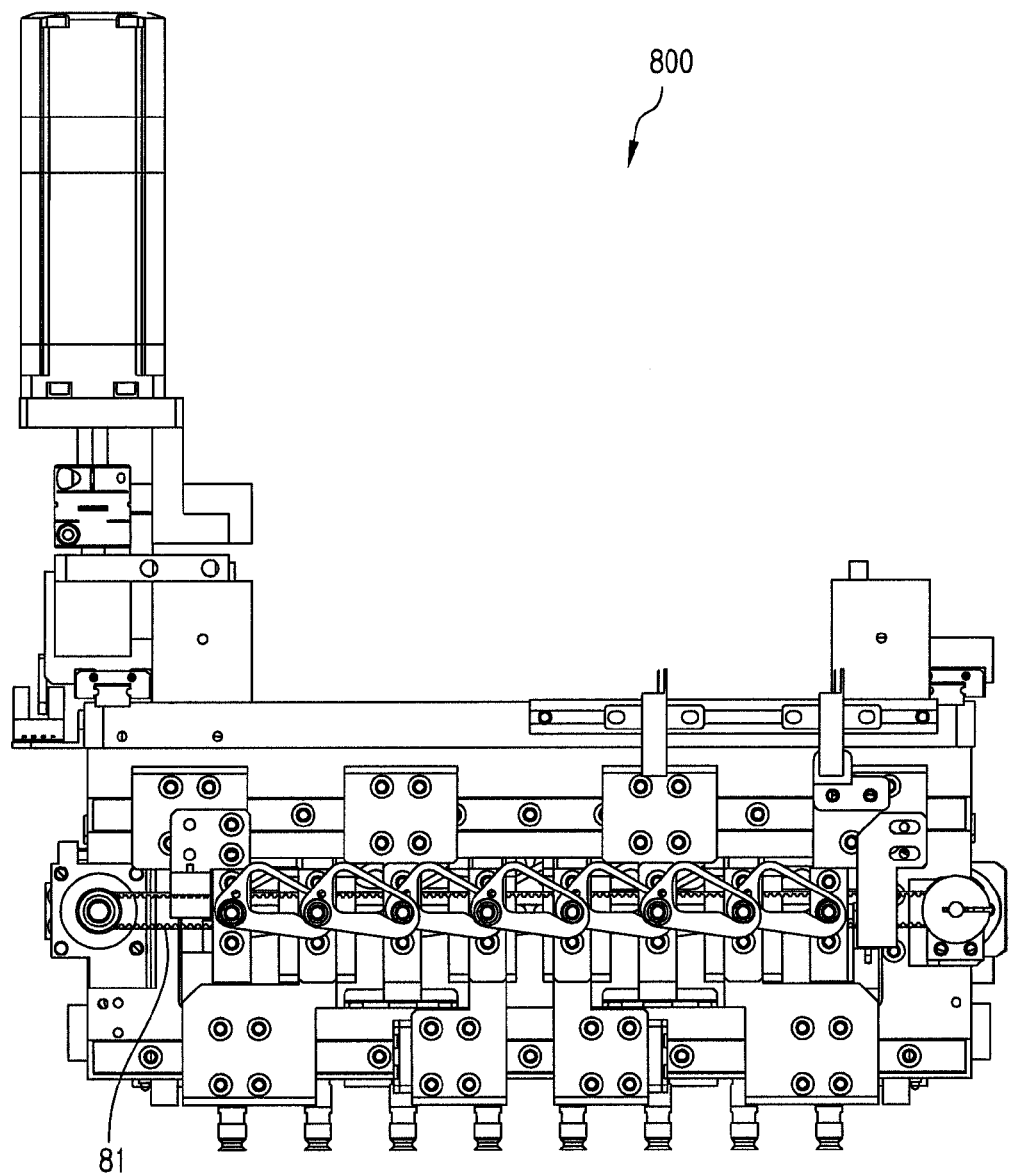

FIG. 9 is a front perspective view of a pick and place apparatus 800 obtained by combining the present invention with the technical conception disclosed in Korean Patent Application No. 10-2005-109164; and FIG. 10 is a front view of the pick and place apparatus 800 shown in FIG. 9. As can be seen from FIGS. 9 and 10, the present invention can also be applied to the pick and place apparatus 800 using a belt 81 as a power transmission mechanism.

Though the embodiment has been described for the case of connecting the device holding elements 21*a*-1 to 21*a*-8 and 21*b*-1 to 21*b*-8 with the pitch setting rings 31 and supplying a power only to the device holding elements 21*a*-1, 21*a*-8 and 21*b*-1, 21*b*-8, the technical conception of the present invention can also applied to the case of supplying the power to all of the device holding elements by using a cam plate (or a cam shaft) as described in Reference 2. That is, the present invention can be applied to any of cases using linear motion guide mechanism for guiding device holding elements regardless of whether the device holding elements are connected by pitch setting rings, which type of power supply mechanism is employed, and which type of power is used, or the like. Further, the present invention can also be applied to the case of using a ball spline as a LM guide.

In accordance with the present invention as described above, the following effects can be obtained.

By reducing the size and weight of the entire pick and place apparatus while increasing the size of the linear motion guide mechanism (i.e., the thickness of LM rails and the width and thickness of LM blocks of LM guides in the embodiment), the endurance and reliability of the pick and place apparatus can be improved without suffering a degradation in its performance.

Further, in accordance with the present invention, the linear motion guide mechanisms in a single set need not be fabricated in pairs and, in particular, in case a power transmission shaft for supplying a moving force to device holding elements as well as guiding movements thereof is intervened between a pair of linear motion guide mechanisms, only the tolerance between the linear motion guide mechanisms and the power transmission shaft needs to be controlled. Thus, the tolerance management becomes easier, which results in improvement of productivity and reduction in manufacturing costs.

Furthermore, by disposing the linear motion guide mechanisms for guiding the device holding elements at the upper and lower portions of the front and the rear portions of the entire apparatus, respectively, the present invention can be applied to the configuration where the device holding elements are symmetrically arranged in the front row and the rear row.

While the invention has been shown and described with respect to the embodiment, it will be understood by those skilled in the art that various changes and modifications may be made without departing from the scope of the invention as defined in the following claims.

What is claimed is:

1. A pick and place apparatus comprising:
a plurality of device holding elements arranged in a row along a horizontal direction;
a power supply mechanism for supplying a power for controlling a horizontal pitch between the plurality of device holding elements;
a power transmission mechanism for delivering the power from the power supply mechanism to the plurality of device holding elements as a translational force in the horizontal direction;
a first linear motion guide mechanism for guiding horizontal movements of some of the plurality of device holding elements; and
a second linear motion guide mechanism disposed below the first linear motion guide mechanism, for guiding horizontal movements of the other device holding elements,
wherein the plurality of device holding elements are slidably coupled to the first and the second linear motion guide mechanism alternately, and
wherein the first and the second linear motion guide mechanisms are stationary.

2. The apparatus of claim 1, wherein the plurality of device holding elements are slidably coupled to the first and the second linear motion guide mechanism so as to be arranged symmetrically with respect to a vertical central line.

3. The apparatus of claim 1, wherein one of the first and the second liner motion guide mechanism is a linear motion guide.

4. The apparatus of claim 3, wherein each of the first and the second liner motion guide mechanism is a linear motion guide.

5. The apparatus of claim 1, further comprising a multiplicity of pitch setting rings for connecting each of the plurality of device holding elements to their neighboring elements, wherein the power transmission mechanism delivers the power from the power supply mechanism to the device holding elements located at both ends of the arrangement in a horizontal direction.

6. A pick and place apparatus comprising:
a plurality of device holding elements arranged in a front row along a horizontal direction;
a multiplicity of device holding elements arranged in a rear row along the horizontal direction behind the front row;
a power supply mechanism for supplying a power for controlling a horizontal pitch between the device holding elements in each row;
a front-row power transmission mechanism for delivering the power from the power supply mechanism to the plurality of device holding elements in the front row as a translational force in the horizontal direction;
a rear-row power transmission mechanism for delivering the power from the power supply mechanism to the multiplicity of device holding elements in the rear row as a translational force in the horizontal direction;
a first front-row linear motion guide mechanism for guiding horizontal movements in some of the plurality of device holding elements of the front row;
a second front-row linear motion guide mechanism for guiding horizontal movements of the other device holding elements in the front row;
a first rear-row linear motion guide mechanism for guiding horizontal movements of some of the multiplicity of device holding elements in the rear row; and
a second rear-row linear motion guide mechanism for guiding horizontal movements of the other device holding elements in the rear row,
wherein the first and the second front-row linear guide mechanism are disposed at a front side with respect to the plurality of holding devices in the front row, while the first and the second rear-row linear guide mechanism are disposed at a rear side with respect to the multiplicity of holding devices in the rear row, wherein the plurality of device holding elements in the front row are slidably coupled to the first and the second front-row linear guide mechanism alternately, while the multiplicity of device holding elements in the rear row are slidably coupled to the first and the second rear-row linear guide mechanism alternately, and wherein the first front-row, the second front-row, the first rear-row and the second rear-row linear motion guide mechanisms are stationary.

7. The apparatus of claim 6, wherein the plurality of device holding elements in the front row are slidably coupled to the first and the second front-row linear motion guide mechanism so as to be arranged symmetrically with respect to a vertical central line, while the multiplicity of device holding elements in the rear row are slidably coupled to the first and the second rear-row liner motion guide mechanism so as to be arranged symmetrically with respect to a vertical central line.

8. The apparatus of claim 6, further comprising plural pitch setting rings for connecting each of the device holding elements in the front and the rear row to their neighboring elements, wherein the front-row power transmission mechanism delivers the power from the power supply mechanism to the device holding elements located at both ends of the front row in a horizontal direction, while the rear-row power transmission mechanism delivers the power from the power supply mechanism to the device holding elements located at both ends of the rear row in the horizontal direction.

9. The apparatus of claim 6, further comprising a front-row power supply mechanism for supplying a power for controlling a horizontal pitch between the plurality of device holding elements in the front row and a rear-row power supply mechanism for supplying a power for controlling a horizontal pitch between the multiplicity of device holding elements in the rear row.

* * * * *